(12) United States Patent
Fei et al.

(10) Patent No.: US 6,556,159 B1
(45) Date of Patent: Apr. 29, 2003

(54) VARIABLE ORDER MODULATOR

(75) Inventors: Xiaofan Fei, Austin, TX (US); Johann G. Gaboriau, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/954,776

(22) Filed: Sep. 17, 2001

(51) Int. Cl.[7] .............................................. H03M 3/00
(52) U.S. Cl. ...................................... 341/143; 341/144
(58) Field of Search ........................................ 341/143

(56) References Cited

U.S. PATENT DOCUMENTS

| | | | | |
|---|---|---|---|---|
| 5,012,244 A | * | 4/1991 | Wellard et al. ............. | 341/143 |
| 5,243,345 A | * | 9/1993 | Naus et al. .................. | 341/143 |
| 5,248,972 A | * | 9/1993 | Karema et al. ............. | 341/143 |
| 5,659,314 A | * | 8/1997 | Tokura et al. .............. | 341/143 |
| 6,011,501 A | * | 1/2000 | Gong et al. ................. | 341/150 |
| 6,087,969 A | * | 7/2000 | Stockstad et al. ........... | 341/143 |
| 6,255,975 B1 | * | 7/2001 | Swanson .................... | 341/143 |
| 6,340,940 B1 | * | 1/2002 | Mclanson ................... | 341/143 |
| 6,362,763 B1 | * | 3/2002 | Wang ......................... | 341/143 |

* cited by examiner

Primary Examiner—Michael Tokar
Assistant Examiner—Khai M. Nguyen
(74) Attorney, Agent, or Firm—James J. Murphy, Esq.; Winstead Sechrest & Minick

(57) ABSTRACT

A delta-sigma modulator 400 includes circuitry 407 for selectively varying an order of the modulator to vary a modulation index of the delta sigma modulator.

23 Claims, 3 Drawing Sheets

VARIABLE ORDER MODULATOR

BACKGROUND OF THE INVENTION

1. Field of Invention

The present invention relates in general to mixed signal processing and in particular, to variable order modulation.

2. Background of Invention

Delta-sigma modulators are particularly useful in digital to analog and analog to digital converters (DACs and ADCs), as well as Codecs and similar mixed signal applications. Generally, delta-sigma modulators, which can operate on either an analog or digital input, generate a quantized output with an average that tracks the average of the input signal. Using oversampling, the delta-sigma modulator spreads the quantization noise power across an oversampling frequency band, which is typically much greater than the input signal bandwidth. Additionally, delta sigma modulators perform noise shaping by acting as a highpass filter to the noise such that most of the quantization noise power is shifted out of the signal band of interest.

The typical delta sigma modulator sums the input signal with negative feedback, performs a linear filtration operation and then a one-bit or multiple-bit quantization. In a first order modulator, the linear filter comprises a single integrator stage while the filter in higher a order modulator comprises a cascade of a corresponding number of integrator stages. Higher order modulators have the advantage of improved noise shaping capability over lower order modulators, although stability becomes a more critical consideration as the order is increased.

During device power-up and power-down, discontinuities can appear in the delta-sigma modulator output. In audio applications, these discontinuities manifest themselves as audible clicks and pops to the listener. Hence, "pop-guard" techniques are typically employed in low-end audio delta-sigma DACs, such as those used to drive headphones and inexpensive speakers.

One common popguard technique ramp-ups and ramp-downs the modulator input during power supply transitions to minimize output discontinuities. For a single-ended modulator configuration, the "quiet" signal level is typically in the middle of the power supply voltage range. Thus, for this configuration, the target is to ramp the output to an from this mid-range voltage level by corresponding ramping of the input voltage.

As discussed further below, to maintain modulator stability, the peak to peak output relative to the power supply rails is limited which consequently limits the ability of the modulator to smoothly ramp the output from the power supply rails. This limitation can itself cause discontinuities in the output and is therefore a significant problem which must be addressed.

SUMMARY OF INVENTION

According to one embodiment of the inventive concepts, a delta-sigma modulator is disclosed which includes circuitry for selectively varying an order of the modulator to vary a modulation index of the modulator.

In general accordance with the inventive principles, the delta-sigma modulator is configured with a low modulator order and a high modulation index during the initial period of ramp-up of the modulator input. The high modulator index allows the resulting output voltage to begin ramping up from relatively close to the low voltage supply rail. Consequently, any jumps in the output voltage are minimized. During normal mode operations, the order of the modulator increases to take advantage of improved high order noise shaping. During input voltage ramp-down, the same process is essentially reversed, such that the last portion of the ramp-down is performed in a low order configuration with a high modulator index such that the output smoothly transitions towards the low power supply rail.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
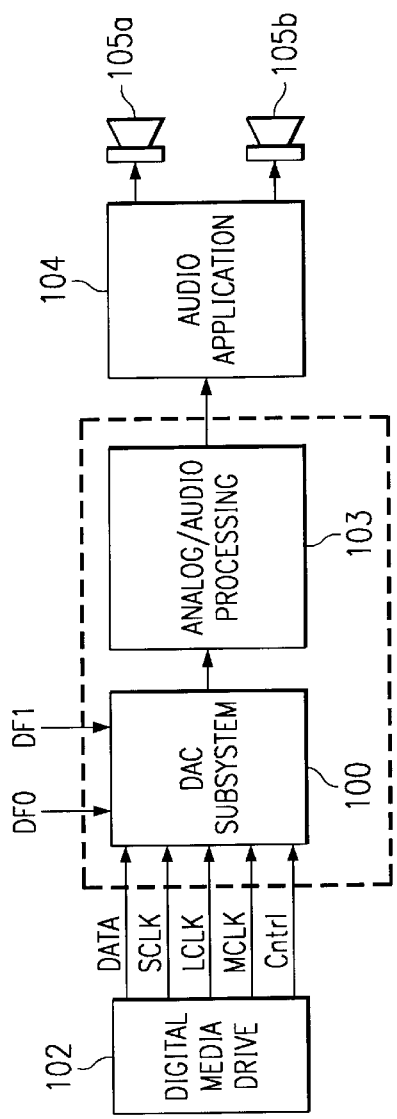
FIG. 1 is a diagram of a typical system application of 1-bit digital to analog converter (DAC)

FIG. 1 is a diagram of a typical system application of 1-bit digital to analog converter (DAC) 100. In this example, DAC subsystem 100 forms part of an audio component 101, such as a compact disk (CD) player, digital audio tape (DAT) player or digital video disk (DVD) unit. A digital media drive 102 recovers the digital data, for example 1-bit audio data in the Sony/Philips 1-bit format from the given digital data storage media, and passes those data, along with clocks and control signals, to DAC subsystem 100. The resulting analog (audio) data undergoes further processing in circuit block 103 prior amplification in amplifier block 104. Amplifier block 104 then drives a set of conventional speakers 105, a headset or the like.

Multi-bit digital audio data may also be received word-serial through the SDATA pin and serial interface/format selector 101 timed by the sampling clock (SCLK). The left and right channel data are alternately processed in response to the left-right clock (LRCK). This clock is normally at the same rate as the data input rate (i.e., the sampling rate). Control signals DF1 and DF0 allow for the selection of the input format, for example, right or left justified, 20-bit or 24-bit word width, to name a few possibilities. When 1-bit data is being input, the SDATA port receives left channel data and the DF1 port right channel data.

Figure 2:
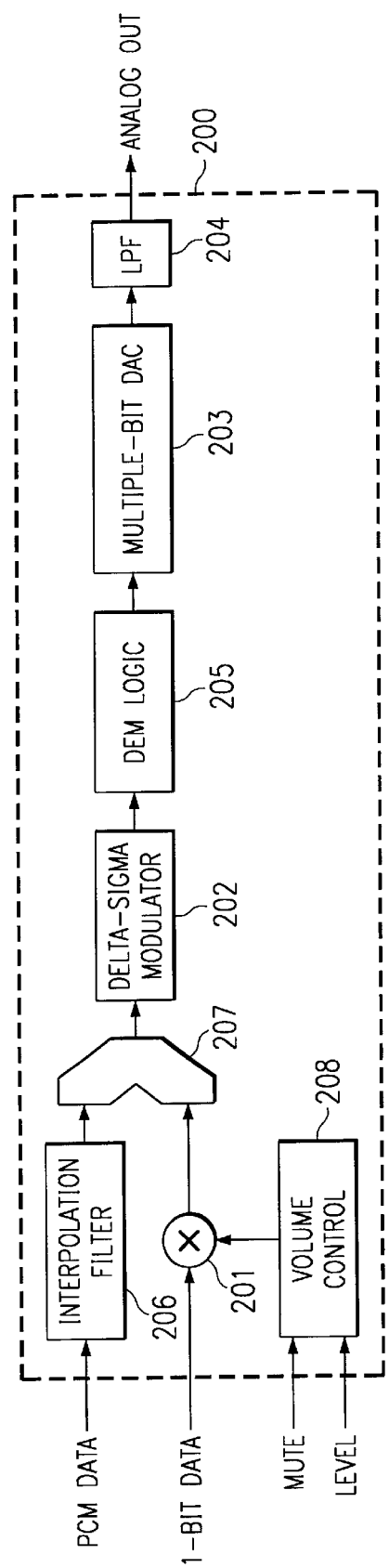
FIG. 2 is a functional block diagram of one channel of a DAC according to the principles of the present invention and suitable for use in DAC subsystem.

FIG. 2 is a functional block diagram of one channel of a DAC 200 according to the principles of the present invention and suitable for use in DAC subsystem 100. DAC 200 includes a gain stage (multiplier) 201 and Delta-Sigma modulator 202, which re-codes and quantizes the output from multiplier 201. The m-level data output from modulator 201 is passed through a switched-capacitor, or other conventional multiple-bit DAC circuit 203, and converted into the analog domain. Analog low pass filter 204 then filters the analog signal. Dynamic element matching (DEM) logic 205 may be provided for shaping noise which may result from DAC element mismatch. Multiplexer 207 selects between traditional multi-bit PCM data and single-bit data at the modulator input.

Volume control circuitry, which can be digital or analog, and converts the input control information into the scaling (multiplication) factors for use by scaling stage 201. Volume control block 208 allows the volume to be ramped up or down, and/or a mute function where the output is gracefully turned-on or off by the same ramping up and ramping down operations.

One measure of delta-sigma modulator performance is the Modulator Index (MI) which represents of the ability of the peak to peak amplitude of the modulator output to approach the high and low output power supply rails in response to the maximum allowable peak-to-peak input voltage swing during stable operation. Hence, the closer to the supply rails the output signal must be, the higher the required MI. To this end, low order modulators typically have a relatively high MI, although the noise shaping capability is poor, and higher order modulator have a lower MI, although their noise shaping capability is significantly better.

To implement a stable popguard in a single-ended configuration, the input voltage should theoretically ramp from its lowest negative value to zero and the output consequently should theoretically ramp from ground to the middle of the power supply voltage range. However, since the modulator has a limited MI (i.e. less than 1.0), the output ramp will start exactly at ground and consequently the output voltage will experience a sudden jump, which could be for example from ground to 5–10% of the power supply voltage. This jump can itself cause a audible pop in the audio output in audio applications. A similar jump from the minimum output level to ground can occur at the end of the ramp-down process.

According to the principles of the present invention, this problem is solved using a variable order delta-sigma modulator. Generally, a low order configuration with very high Ml is used up to a given output voltage threshold, which allows the output ramp to start close to zero volts (ground). After the threshold has been met, the order is increased, preferably sequentially, such that during normal operations a high order configuration is used having the desired high order noise shaping. Conversely, during the ramp-down the order is reduced until the threshold is reached, at which point the low order-high MI configuration is used to bring the output down as close to zero volts as possible.

Figure 3:
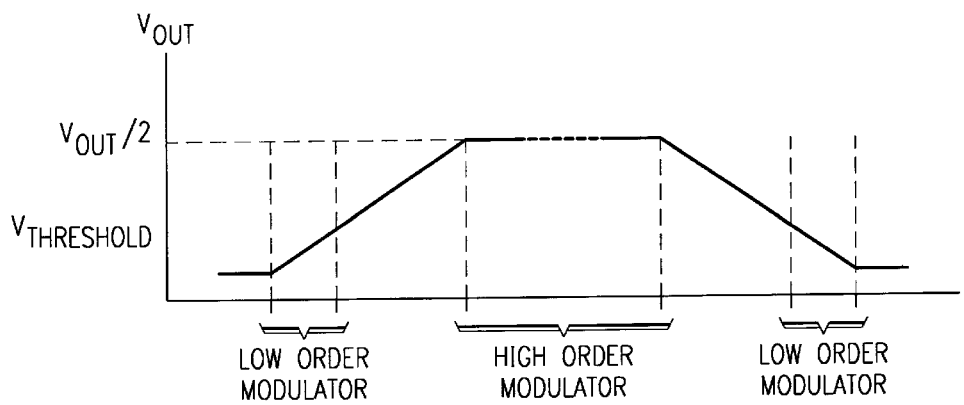
FIG. 3 is a plot of modulator output versus time and graphically illustrates the process of varying modulator order during modulator output ramp-up and ramp-down.

The preferred operating process is illustrated graphically in FIG. 3, which is an approximate plot of the output voltage level $V_{Out}$ versus time. The threshold points ($V_{THRESHOLD}$) at which the change in order are triggered will vary based on the given modulator design. One possible threshold setting for switching from the lowest modulator order (i.e., 1) is:

Vout/2−(Vout/2*$MI_{HighOrder}$)

For example, assume that the power supply voltage is nominally 5V and the MI is nominally 0.8 for the full order of the modulator. The output swing is therefore approximately 2.5±(2.5*0.8) or from 0.5 to 4.5 volts. Assuming that the modulator response is monotonic, the ramp with the low order-high Ml configuration would drive the output from 0 to 0.6 V and the higher order configuration or configurations from 0.6 to 2.5V. From this, the corresponding input for the monotonic output response is determined such that the modulator order can be varied as a function of the input.

Figure 4:
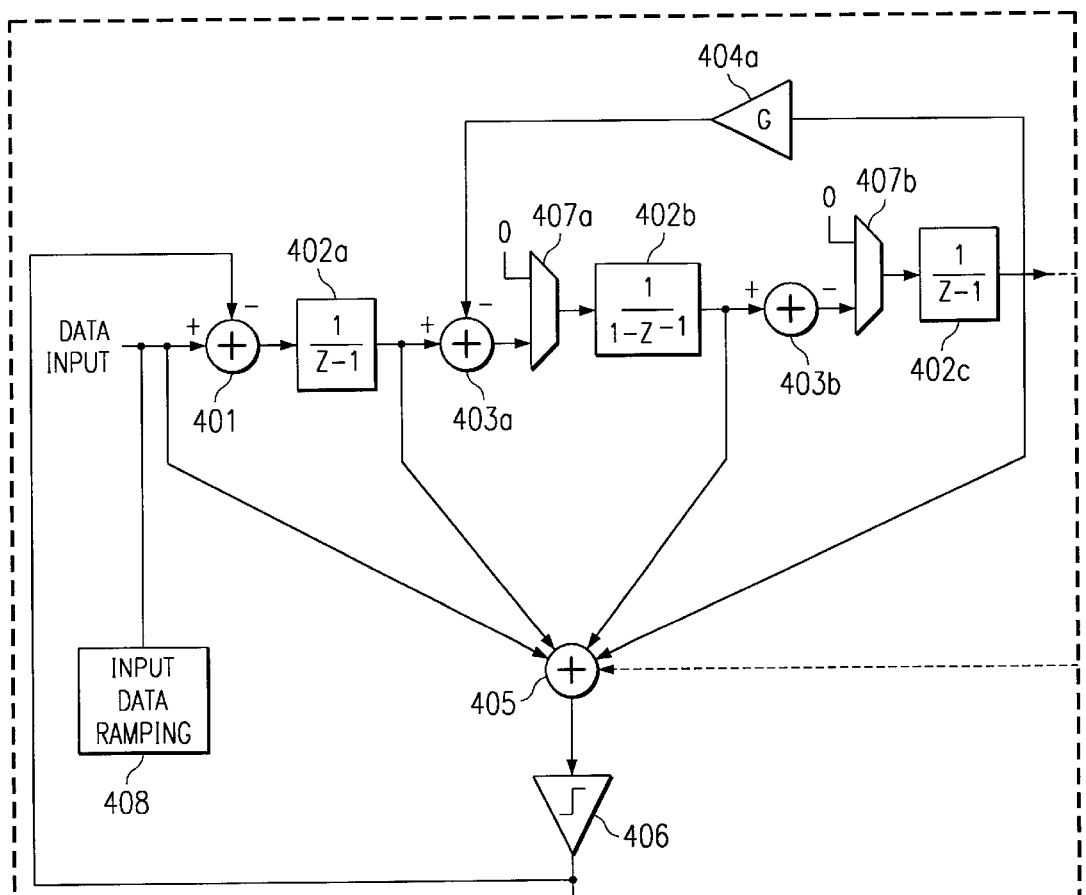
FIG. 4 is a functional block diagram of the first three stages of an nth order feedforward delta-sigma modulator embodying these concepts.

FIG. 4 is a functional block diagram of the first three stages of an nth order feedforward delta-sigma modulator 400 embodying these concepts. It should be noted that the order may change from specific design to specific design, depending on such factors as the required noise shaping response and stability concerns. Moreover, while a feedforward design operating on a digital input is shown, other designs can be used, including those operating on an analog input stream.

The input stream is received at the non-inverting input of input summer 401 and summed with feedback received from the quantizer at the summer inverting input. For an nth order modulator, the filter comprises n number of integrator stages 402, the outputs of which are summed by output summer 405. In the illustrated embodiment, the output of at least some integrator stages 402 is feedback to a inverting summer 403 of the previous stage through a gain stage 404. The summed output from summer 405 is then requantized by quantizer 406 and passed to DAC 203 and eventually the output amplifiers.

In order to vary the order of the modulator, a set of multiplexers (selectors) 407 are provided between integration stages. To decrease the order of the modulator, selected integrator stages 402 are removed, preferrably starting with the last currently active stage in the chain, by switching the input of the selected stage or stages from the output previous integrator stage to a logic zero (or 0 volts in the case of an analog modulator). The contribution of the removed stages or stages at the summer 405 is effectively zero. To increase the modulator order, active stage are returned to the chain, preferrably beginning with the last currently active stage, by switching the corresponding input of the selected stages back to the output of the previous stage.

For the digital embodiment, the input is ramped-up and ramped-down in a manner similar to that used for volume control. For example, ramp control block 408 can step the digital input from a maximum negative signed digital value (corresponding to zero in the output voltage range) to a value corresponding to the midpoint in the output voltage range.

Figure 5:
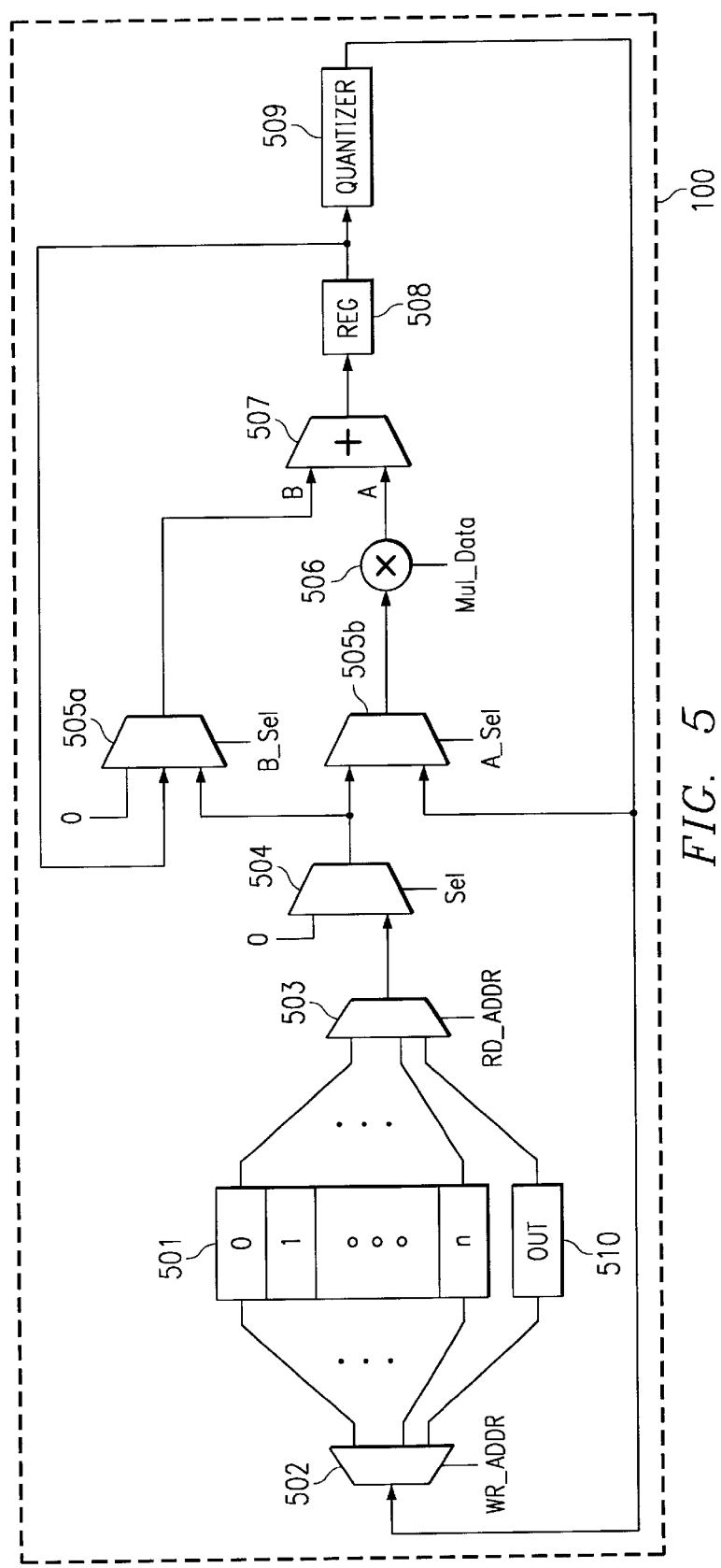
FIG. 5 illustrates the case in which a register file or memory with n-number of entries is used to store and retrieve the digital values generated from the integration operations.

One particular digital implementation of delta-sigma modulator 400 is the DSP implementation illustrated in FIG. 5. In this case, a register file or memory 501 with n-number of entries is used to store and retrieve the digital values generated from the integration operations. Data is written into the register entries though write multiplexer 502 in response to a write address WR_ADDR and read from the register entries through read multiplexer 503 in response to read address RD_ADDR.

A multiplexer 504 allows the order of the modulator to be changed by selecting between a Logic 0 and the output of read multiplexer 503. The integration is logically implemented as a pair of multiplexers 505a,b, a multiplier 506 and adder 508. A register 508 and quantizer 509 complete the feedback loop.

It should be recognized that when operating in the normal mode regime, variable-order modulator 400 does not have to operate at its highest order. For example, it may be necessary or desirable to change the MI of the modulator dynamically during normal mode operations. The embodiments of modulators 400 allow this to be done in a relatively straightforward manner.

The final result is made available in output register 510 though the read and write multiplexers 502 and 503.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A delta sigma modulator comprising circuitry for selectively dynamically varying an order of the modulator in response to ramping a level of an input data stream.

2. The delta sigma modulator of claim 1 wherein the circuitry for selectively varying the order of the modulator varies the order during ramp-up and ramp-down of an input data stream to reduce discontinuities in a generated output stream.

3. The delta sigma modulator of claim 1 wherein the circuitry for selectively varying the order of the modulator dynamically varies the order during normal mode operations of the delta sigma modulator.

4. The delta sigma modulator of claim 1 wherein the modulator comprises a plurality of cascaded integrator stages and the circuitry for varying the order of the modulator comprises circuitry for selectively varying a contribution from selected ones of the integrator stages in the generated output stream.

5. The delta sigma modulator of claim 4 wherein the circuitry for selectively varying the contribution from selected ones of the integrator stages comprises a multiplexer for selecting for input to a selected one of the integrator stages between an output of a previous integrator stage and a zero value.

6. The delta sigma modulator of claim 1 wherein the input data stream comprises an audio data stream.

7. The delta sigma modulator of claim 1 wherein the delta sigma modulator is implemented in a digital signal processor.

8. The delta-sigma modulator of claim 1 wherein the circuitry for selectively varying an order of the modulator varies the order during ramp-up of the level of an input data stream.

9. The delta-sigma modulator of claim 1 wherein the circuitry for selectively varying an order of the modulator varies the order during ramp-down of the level of an input data stream.

10. A method for reducing discontinuities in a data stream output from a delta sigma modulator comprising the steps of:

configuring the delta sigma modulator to have a low modulator order and a high modulation index;

ramping-up an input signal to the delta sigma modulator up to a selected threshold to drive an output of the delta sigma modulator with the high modulation index; and reconfiguring the delta-sigma modulator after ramping the input signal to the threshold to increase the modulator order.

11. The method of claim 10 wherein the low modulator order is one.

12. The method of claim 10 and further comprising the steps of:

ramping-down the input signal until the threshold is reached; and reconfiguring the delta sigma modulator after ramping-down the input voltage to the threshold to the low order to drive the output with the high modulation index.

13. The method of claim 10 wherein the delta sigma modulator comprises a plurality of cascaded integrator stages and said step of configuring the delta sigma modulator to have a low modulator order comprises the step of selectively switching an input of a first integrator stage from an output of a second integrator stage to a fixed value.

14. The method of claim 13 wherein the delta sigma modulator comprises a plurality of cascaded integrator stages and said step of reconfiguring the delta sigma modulator to increase the modulator order comprises the step of selectively switching the input of the first integrator stage from the fixed value to the output of the second integrator stage.

15. The method of claim 13 wherein said steps of configuring and reconfiguring are implemented in a digital signal processor.

16. The method of claim 13 wherein the input signal comprises a stream of digital data.

17. The method of claim 13 wherein the input signal comprises audio data.

18. An audio circuit comprising:

a variable order delta-sigma modulator having a low order during ramp-up of a input signal level during power-up of the audio circuit and a higher order during normal mode processing of an audio data stream.

19. The audio circuit of claim 18 wherein said delta sigma modulator comprises a digital delta sigma modulator and the audio data stream comprises 1-bit digital audio data.

20. The audio circuit of claim 18 wherein said delta sigma modulator comprises a digital delta sigma modulator and the audio data stream comprises a stream of multi-bit digital audio data.

21. The audio circuit of claim 20 wherein the delta sigma modulator forms a portion of a digital to analog converter.

22. The audio circuit of claim 20 wherein the delta sigma modulator is implemented at least in part with a digital signal processor.

23. The audio circuit of claim 20 wherein the delta sigma modulator comprises:

a plurality of cascaded integrator stages; and a plurality of multiplexers for selectively varying a contribution to an output stream by selected ones of the stages to increase and decrease the order of the modulator.

* * * * *